(12) United States Patent
Rakshit et al.

(10) Patent No.: US 10,895,950 B2
(45) Date of Patent: Jan. 19, 2021

(54) METHOD AND SYSTEM FOR GENERATING A HOLOGRAPHIC IMAGE HAVING SIMULATED PHYSICAL PROPERTIES

(71) Applicant: INTERNATIONAL BUSINESS MACHINES CORPORATION, Armonk, NY (US)

(72) Inventors: Sarbajit K. Rakshit, Kolkata (IN); Shilpa S. Shetty, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 424 days.

(21) Appl. No.: 15/373,873

(22) Filed: Dec. 9, 2016

(65) Prior Publication Data

US 2018/0164982 A1 Jun. 14, 2018

(51) Int. Cl.
*G06F 3/0481* (2013.01)
*G03H 1/00* (2006.01)
(Continued)

(52) U.S. Cl.
CPC ....... *G06F 3/04815* (2013.01); *G03H 1/0005* (2013.01); *G03H 1/0808* (2013.01);
(Continued)

(58) Field of Classification Search
CPC ............. G06H 1/00; G06H 2001/0061; G06H 1/0005; G06H 1/2249; G06H 1/0808;
(Continued)

(56) References Cited

U.S. PATENT DOCUMENTS

| 6,211,848 B1 * | 4/2001 | Plesniak | G06F 3/016 345/156 |
| 6,831,640 B2 * | 12/2004 | Shih | G06F 3/016 345/419 |

(Continued)

OTHER PUBLICATIONS

Digsby; Holograms are finally here: Plasma lasers used to create images in mid-air; Retrieved from the Internet on May 30, 2016; URL: http://www.pocket-lint.com/news/131622-holograms-are-finally-here-pl . . . ; 7 pages.

(Continued)

*Primary Examiner* — Andrew L Tank
(74) *Attorney, Agent, or Firm* — Schmeiser, Olsen & Watts; Nicholas L. Cadmus

(57) ABSTRACT

A method, system and program for producing an interactive three-dimensional holographic image, including the steps of generating, by one or more processors of a computer system, a virtual object and assigning physical properties to the virtual object using metadata. Signals are received from a virtual tool to determine a position of the virtual tool. Interactive force between the virtual tool and the virtual object are calculated based on the signals from the virtual tool and the position of the virtual tool. A modified virtual object is generated based on the interactive forces and the physical properties, and the modified virtual object is displayed as a holographic image. The system may also determine a force feedback according to the position of the virtual tool in relation to the virtual object, send the force feedback to a user through a haptic interface device; and update the force feedback according to movement of the virtual tool in real space.

20 Claims, 16 Drawing Sheets

(51) Int. Cl.
*G06F 3/01* (2006.01)
*G06F 3/03* (2006.01)
*G03H 1/08* (2006.01)
*G06F 3/0346* (2013.01)
*G06F 3/042* (2006.01)
*G06F 30/20* (2020.01)

(52) U.S. Cl.
CPC .............. *G06F 3/011* (2013.01); *G06F 3/016* (2013.01); *G06F 3/017* (2013.01); *G06F 3/0304* (2013.01); *G06F 3/0346* (2013.01); *G06F 3/0421* (2013.01); *G06F 30/20* (2020.01); *G03H 2001/0061* (2013.01); *G03H 2210/30* (2013.01); *G03H 2226/02* (2013.01); *G03H 2226/05* (2013.01); *G06F 2203/04101* (2013.01)

(58) Field of Classification Search
CPC ........... G06H 2226/02; G06H 2226/05; G06H 2210/30; G06F 3/014; G06F 3/017; G06F 3/016; G06F 3/04815; G06F 3/0304; G06F 3/0346; G06F 3/011; G06F 3/0421; G06F 30/20; G06F 2203/04101
See application file for complete search history.

(56) References Cited

U.S. PATENT DOCUMENTS

| | | | | |
|---|---|---|---|---|
| 8,847,919 | B2 | 9/2014 | Krah | |
| 9,183,676 | B2* | 11/2015 | McCulloch | ........... G06T 19/006 |
| 10,169,918 | B2* | 1/2019 | Rehmeyer | ............. G06T 19/006 |
| 2005/0052714 | A1 | 3/2005 | Klug et al. | |
| 2007/0139375 | A1* | 6/2007 | Rosenberg | .............. A63F 13/06 |
| | | | | 345/161 |
| 2007/0239409 | A1* | 10/2007 | Alan | ................... G06F 17/5009 |
| | | | | 703/2 |
| 2008/0088620 | A1* | 4/2008 | Shih | ........................ G06F 3/016 |
| | | | | 345/420 |
| 2009/0237763 | A1 | 9/2009 | Kramer et al. | |
| 2010/0245237 | A1* | 9/2010 | Nakamura | .............. A63F 13/02 |
| | | | | 345/156 |
| 2011/0261427 | A1* | 10/2011 | Hart | ....... G03H 1/2249 |
| | | | | 359/22 |
| 2013/0328762 | A1* | 12/2013 | McCulloch | .......... G02B 27/017 |
| | | | | 345/156 |
| 2014/0002442 | A1* | 1/2014 | Lamb | ..................... G06F 3/1431 |
| | | | | 345/419 |
| 2014/0049559 | A1* | 2/2014 | Fleck | ................... G03H 1/2249 |
| | | | | 345/633 |
| 2014/0071506 | A1 | 3/2014 | Han et al. | |
| 2014/0306993 | A1* | 10/2014 | Poulos | .................. G06T 19/006 |
| | | | | 345/633 |
| 2016/0195849 | A1* | 7/2016 | Takagi | ................. G03H 1/2249 |
| | | | | 348/40 |
| 2016/0210781 | A1* | 7/2016 | Thomas | ................. G06T 19/006 |
| 2016/0267664 | A1* | 9/2016 | Davis | ....................... G06T 13/80 |
| 2017/0003738 | A1* | 1/2017 | Silkin | ..................... G06F 3/011 |

OTHER PUBLICATIONS

Jozuka, Emiko; Invisible 3D objects can be felt thanks to haptic holograms; Retrieved from the Internet May 30, 2016; URL: http://www.wired.co.k/article/mars-is-emerging-from-an-ice-age-that-e . . . ; 19 pages.

Lehtimaki, Taina M. et al.; Displaying digital holograms of real-world objects on a mobile device using tilt-based interaction; 2010 9th Euro-American Workshop on Information Optics (WIO); Jul. 12-16, 2010; 3 pages.

Reuters; 3D virtual objects that can be touched and felt; Technology; Apr. 8, 2015; http://www.reuters.com/article/us-touchable-virtual-reality-idUSKNBO . . . ; 4 pages.

Rossignol, Joe; Apple granted patent for interactive holographic display device; Sep. 30, 2014; URL: http://www.iphonehacks.com/2014/09/apple-patent-interactive-holograph . . . ; 6 pages.

Russon, Mary-Ann; Touchable 3D holograms in daylight now possible using superfast femtosecond lasers; IB Times; Jun. 30, 2015; 2 pages.

\* cited by examiner

METHOD AND SYSTEM FOR GENERATING A HOLOGRAPHIC IMAGE HAVING SIMULATED PHYSICAL PROPERTIES

FIELD OF THE INVENTION

A system and method for controlling and operating a display apparatus, and more particularly, for providing an interactive three-dimensional holographic display system, method and device for holograms attributed with simulated physical properties for physical analysis.

BACKGROUND OF THE INVENTION

Holographic displays are used to display objects in three dimensions. Typical interactive devices are incapable of providing an interactive three-dimensional holographic display that sufficiently displays the result of interactions with the object being displayed.

SUMMARY OF THE INVENTION

The present invention is directed to solving issues relating to one or more of the problems presented in the prior art, as well as providing additional features that will become readily apparent by reference to the following detailed description when taken in conjunction with the accompanying drawings.

A method, system and program is provided for producing an interactive three-dimensional holographic image, including the steps of generating, by one or more processors of a computer system, a virtual object and assigning physical properties to the virtual object using metadata. Signals are received from a virtual tool to determine a position of the virtual tool. Interactive force between the virtual tool and the virtual object are calculated based on the signals from the virtual tool and the position of the virtual tool. A modified virtual object is generated based on the interactive forces and the physical properties, and the modified virtual object is displayed as a holographic image. The system may also determine a force feedback according to the position of the virtual tool in relation to the virtual object, send the force feedback to a user through a haptic interface device; and update the force feedback according to movement of the virtual tool in real space.

DETAILED DESCRIPTION OF THE EMBODIMENTS

In the following description of embodiments, reference is made to the accompanying drawings which form a part hereof, and in which it is shown by way of illustration specific embodiments in which the invention can be practiced. It is to be understood that other embodiments can be used and structural changes can be made without departing from the scope of the disclosed embodiments.

This invention relates to a display system configured to produce an interactive three-dimensional holographic image where the digital object will be assigned appropriate physical properties as metadata, for example, hardness, water content, compressive strength, viscosity etc. A camera and proximity sensor installed in the apparatus may analyze hand and/or finger movement patterns around the holographic object and accordingly will identify a type of force being applied, amount of applied force, and impact of applied force upon the holographic object. The display system will calculate the resultant physical reaction of the object to the forces being applied and display the object taking into account any changes in the physical appearance of the object.

According to an embodiment, the apparatus of the invention may change the structure and shape of the holographic object based on identified force parameters, material content of the object, and the user-selected scaling information. The shape of the object may change according to the laws of the physical object.

Another embodiment is directed to method for producing an interactive three-dimensional holographic image where software has analyzed the amount of applied force, the direction of the force, and the type of applied force, accordingly from a selected scale. The software will relate the material properties of the object to calculate a resultant shape and the holographic projector will recreate a new shape of the object gradually based on the applied forces and the physical properties of the object. In this way, the user will be able to determine how the object is changing based on the applied force and associated physical parameters.

Many types of interactive devices are available for performing operations in a computing system. Interactive display screens (e.g., touch screens, in particular) are becoming increasingly popular because of their ease and versatility of operation as well as their declining price. Touch screens generally allow a user to perform various functions by touching (e.g., physical contact or near-field proximity) the touch sensor panel using a finger, stylus or other interactive object at a location dictated by a user interface (UI) being displayed by the display device. Typical touch screens, however, provide a two-dimensional display on a substantially flat surface.

Figure 1:
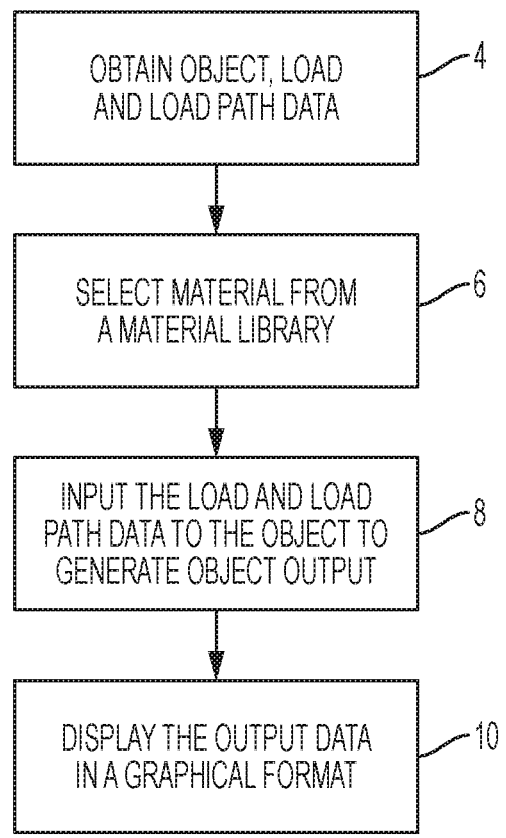
FIG. 1 is a flowchart illustrating an exemplary process for generating an object having physical properties and applying forces to the object, in accordance with embodiments of the present invention.

FIG. 1 is a flowchart illustrating an exemplary process for generating an object having physical properties and applying forces to the object, in accordance with embodiments of the present invention. Data describing the object to be modeled, load data, and load path data are first obtained (block 4). A material and associated material properties are then selected from a plurality of materials in a material library (block 6). The objects and materials may be contained in an object and/or materials library or may be created using known computer-aided drafting techniques. The object shape, load, and load path data are then input to the selected model to generate object output (block 8). Finally, the object output is displayed using a graphical format (block 10) as a hologram.

Figure 2:
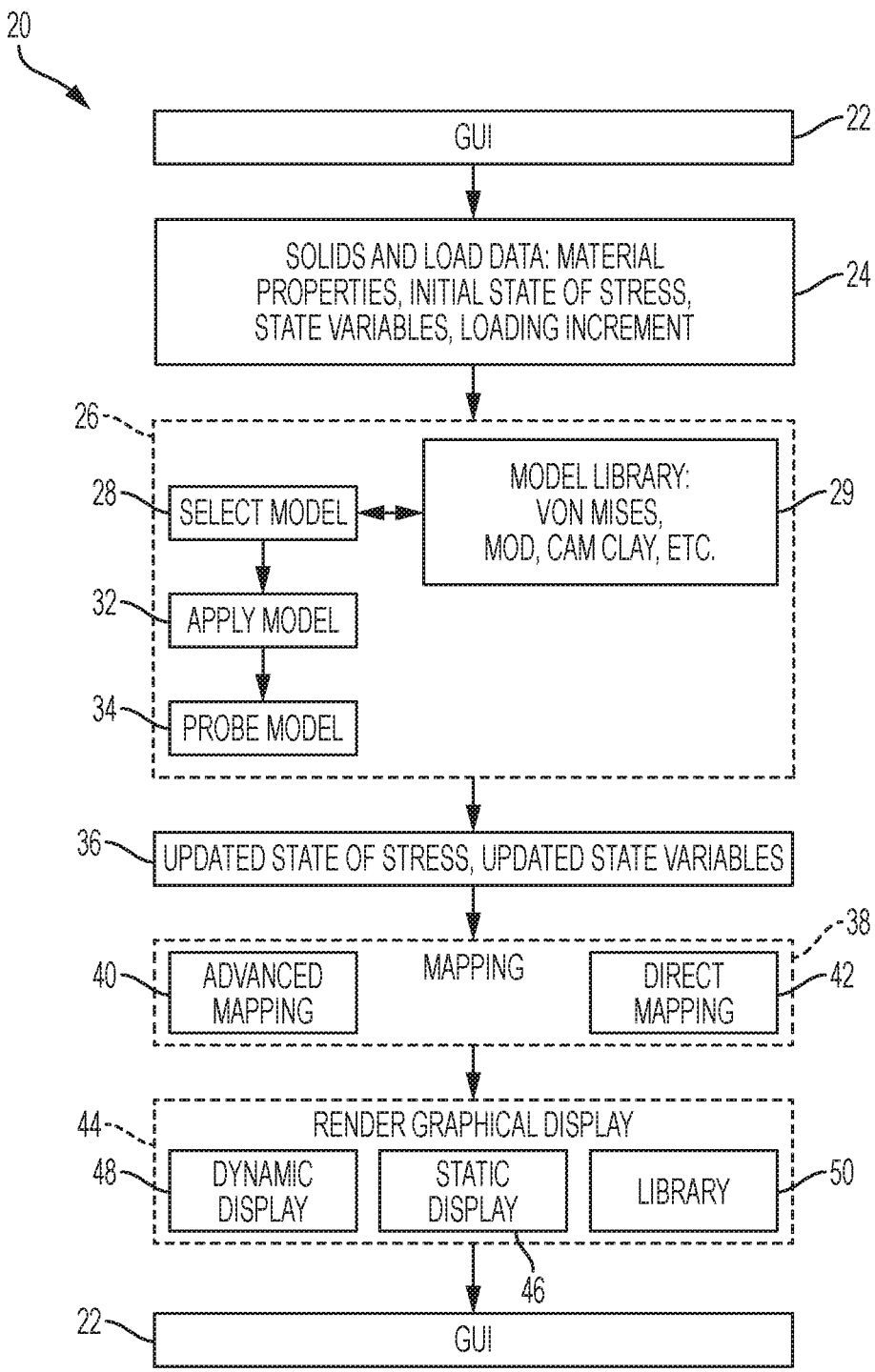
FIG. 2 is a flowchart illustrating a system, in accordance with embodiments of the invention.

With this general example embodiment having now been presented, a more detailed embodiment may be described. Accordingly, reference is made to FIG. 2 illustrating a second example embodiment of the present invention. In particular, FIG. 2 is a flowchart useful for illustrating an example computer program system and method 20 of the invention. The embodiment 20 comprises a graphic user interface (block 22) or "GUI" for interfacing with a user for receiving input data, displaying output data, and the like. Those knowledgeable in the art will appreciate that for the purposes of inputting data the GUI 22 may comprise any of a variety of forms, with an example comprising visually displayed symbols, characters, and the like on a screen or like display.

Through the GUI (block 22) the embodiment 20 may obtain input data (block 24) to be used for object modeling such as a description of the object, load data, load path data, material property data, initial state of stress, state variables, loading increment, and the like. This data may be input by the user through manual data entry, through automated entry with menu selection items, by signals received from sensors, etc. In addition to being obtained through the GUI 22, some or all of this data may also be obtained through retrieval of existing data stored in a database or repository, on a portable medium, or on another like storage medium.

Once the input data is obtained, it will be communicated to a modeling module (dashed line block 26). The modeling module (block 26) includes: selecting a model (block 28) from a model library (block 29), applying the model by inputting the data to the model to generate model output (block 30), and probing the model output (block 32).

The model library (block 29) preferably comprises a plurality of models, with at least one of the models comprising one or more constitutive models. Also, the model library may be accessible to users through the GUI or other means so that models may be added, modified, and/or deleted as desired over time. The availability of a plurality of models in one location for convenient application to the problem at hand is an advantage of the present invention. In a sense, the invention embodiment comprising a plurality of models to experiment with thereby provides a workbench for convenient use of different modeling tools. The model may be uniquely generated by the user using known computer aided drafting software, and then added to the model library.

A general state of loading can be input manually or linked to output from an analysis performed using a finite element, finite difference, boundary element, meshless technique, or similar method. For example, an invention program product embodiment may comprise performing a finite element analysis on a body, and selecting an individual element of that body using a cursor or other selector at the conclusion of the analysis. The load path data associated with this element under the finite element analysis will then be used in applying the selected constitutive model.

The embodiment 20 further comprises a step of probing the model (block 34). As used herein, the term "probing the model" is intended to broadly refer to checking the model output data for performance. For example, the probing of the model may comprise verifying that the model as applied to the input data obeys basic laws of conservation in mechanics. In addition, the probing of a model may probe the predictive capability of the constitutive relation as well as its completeness. For example, the probing of a model may comprise verifying that energy or work is not extracted from a constitutive relation, and thus provides an indication of the stability of the model.

After applying and probing the model, model output data is obtained (block 36). Generally, the model output data comprises the results of calculations and representations made to the input data using the selected model. In summary, the model output generally comprises an updated state of stress and state variables. The model output data may also comprise flags or other logical data that define the yield, failure, and potential surfaces.

The embodiment 20 next comprises steps of mapping the model output data (block 38). Mapping may generally be thought of as providing a framework and bounds for visually representing the model output data. During mapping, the model output data is further processed for visual display in a graphical format. In the embodiment 20, mapping is provided according to an advanced (block 40) or a direct (block 42) scheme.

Steps of direct mapping (block 42) enable the mapping of selected stress and strain scalar values in two or three dimensions. Direct mapping is used to represent up to three components of stress, and can superimpose the constitutive model geometry over the stress paths in conventional space. Direct mapping can map: stress and strain response due to loading specified in the loading path module the yield surface, flow rule, and Mohr circle of stress in a two dimensional space, any pair of the 12 independent components of stress and strain. Other components can also be mapped such as step number, constitutive model state variables, and mean-deviatoric stress components in three-dimensional space, any combination for the stress tensor and principal stress values, which can be mapped in principal stress space. This allows the stress path to be mapped in relation to the hydrostatic axis and n-line with superimposed constitutive model geometry.

Direct mapping for constitutive model output data, stress paths, and the like may be useful for simple loading cases such as uniaxial compression or extension or triaxial loading. However, under a general loading condition, or when examining the stress history result at a point from a finite element analysis, all stress and strain components carry relevant information about the loading history experienced. Advanced mapping (block 40) may be useful for such cases.

Advanced mapping techniques may comprise use of a glyph, a hyper streamline, or other geometric shape to graphically represent second order symmetric stress tensors or similar representation techniques. Four or greater stress, strain, or state variables may be represented using advanced mapping. As an example, in these techniques problems associated with visualizing six independent components are resolved by representing three orthogonal unit vectors whose magnitude is equal to the eigenvalue of the second order tensor, and whose direction is defined by the corresponding eigenvector. Advanced mapping techniques such as use of glyph and glyph-like geometric shapes allow for data that describes six components to be represented using only a three dimensional shape. This may be accomplished by taking advantage of mapping and rendering densities, surfaces, and like details of the shape. An invention embodiment may comprise using advanced or direct mapping based on a user input selection. For example, the GUI 22 may provide an interface for a user to select one or more modes of mapping.

Following mapping, the embodiment 20 comprises rendering a graphical display of the mapped output data (block 44) using the exemplary system described below. Method and program product embodiments of the invention comprise rendering a static graphical display (block 46) or a dynamic display (block 48) of the model output data. The display may be presented in two or three dimensions, and may comprise animation. The static display component preferably comprises three dimensions, including, for example, a volume and a surface represented by a hologram. In the invention embodiment 20, the steps of rendering a dynamic graphical display (block 48) of the model comprise changing the graphical display in response to changes in the input or other data.

In this manner, a user may quickly and decisively examine the results of changes in load and/or load path data, for example. The display may be presented in a two or three dimensional rendering of loading paths and the model output data. For three-dimensional renderings, dynamic display allows the user to navigate through the space to view the model and view it from different angles as the stress path changes. Dynamic display also allows rotation and lateral movement within the display space.

The inventive embodiment 20 further comprises an object or model library 50 for use in rendering of a graphic display of the output data. The object or model library 50 may comprise data for a variety of geometric shapes that may be used in models such as constitutive models, for instance. Shapes may include, but are not limited to, three dimensional shapes such as an arrow, cone, cube, sphere, cylinder, and the like. It has been discovered that use of pre-defined and pre-existing shapes from a library speeds the processing of embodiments of the present invention. The final output graphical display may be presented for user viewing using the GUI 22.

Figure 3:
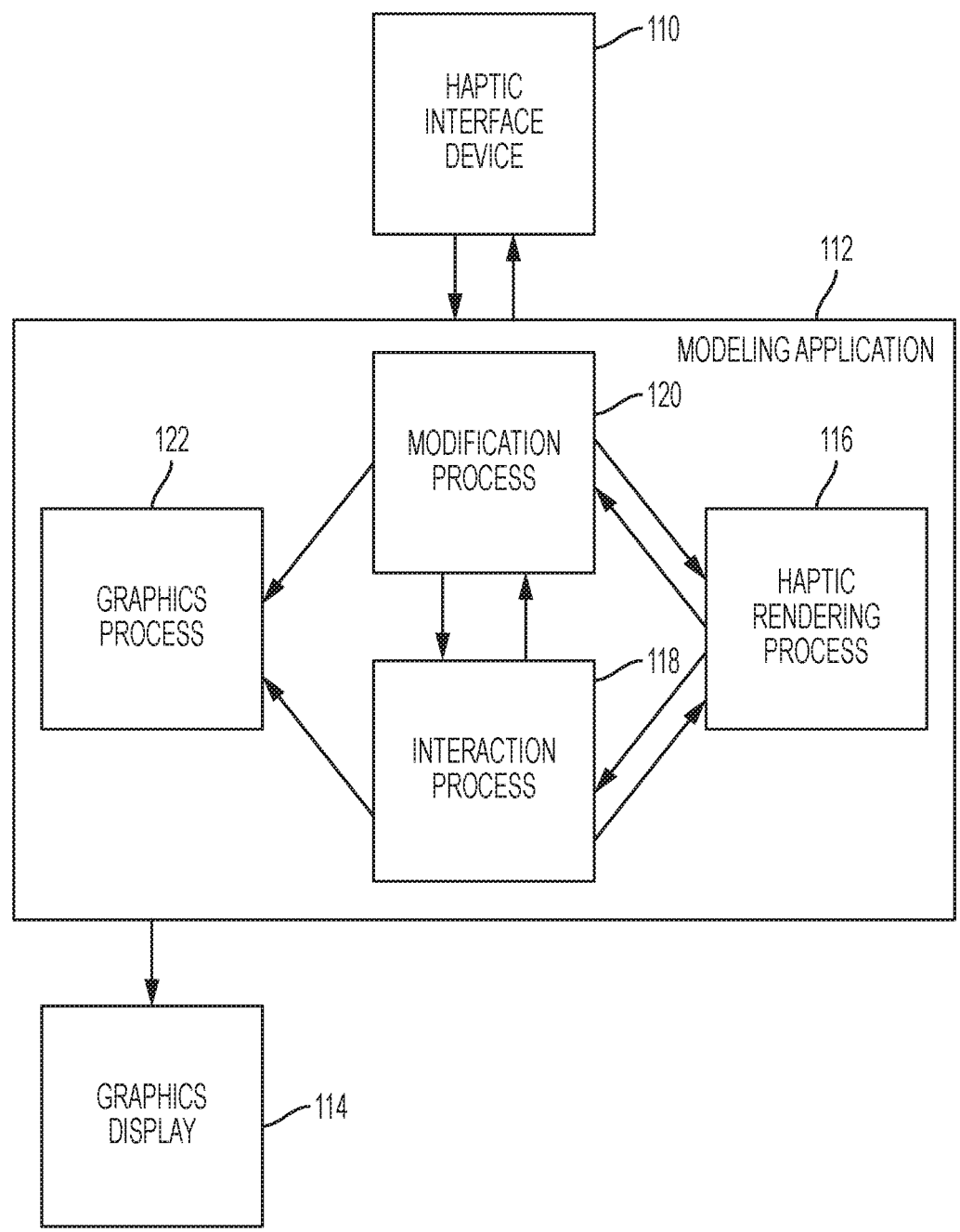
FIG. 3 illustrates a functional block diagram of a system including a haptic interface device, modeling apparatus, and graphics display in accordance with embodiments of the invention.

FIG. 3 illustrates a functional block diagram of a system including a haptic interface device, modeling apparatus, and graphics display in accordance with embodiments of the invention. In accordance with one embodiment, a user of the system may use the haptic interface device 100 to interact with the virtual object 126 (see FIG. 3) receiving force feedback produced by the haptic rendering process and viewing graphics rendered by the graphics process on a graphic display 44. The haptic interface device 100 may comprises a user-operated sensor system such as glove embedded with sensors. For example, user may employ a wearable device (e.g. ring) on the thumb and/or index finger or an embeddable device (e.g., an e-tattoo, or conductive paint) on the nails and/or fingers, so that the device will measure the relative movement among each detectable element and also measure the speed and direction of movement. In this manner, the paired computing devices will precisely measure the movement and forces applied to the virtual object in a very precise manner.

In a haptic interface embodiment, the process, as referred to in FIG. 3, is a software process executing on a hardware microprocessor. All the processes may execute on one microprocessor, or in other embodiments, one or more processes may execute on different microprocessors, which are linked by buses, cables, local networks, wide area networks, or global computer networks, such as the Internet.

The modeling application as viewed in FIG. 3 as a software application executing on one computer system. In another embodiment, the modeling application executes on one or more computer systems connected by a communications device, such as a bus, cable, or network connection. In an alternate embodiment, the modeling application is a hardware device, such as an ASIC (application specific integrated circuit), and one or more processes of the application are implemented on one or more ASIC devices. In a further embodiment, the modeling application is implemented as one or more objects, which may execute on one or more computer systems.

As shown in FIG. 3, the modeling application 112 is preferably but not required to include a haptic rendering process 116, an interaction process 118, a modification process 120, and a graphics process 122. In one embodiment, the functions of the modeling application 112 are implemented by a different number of processes. In one embodiment, the modeling application 112 includes the haptic rendering process 116 and the graphics process 122.

The invention may be implemented using an object-oriented approach. The haptic rendering process 116 and other processes are implemented as software objects. In another embodiment, the virtual object 126 and the virtual tool 128 (FIG. 4) are implemented as software objects and perform one or more of the functions of the haptic rendering process 116. The final image is displayed on the graphics display 114.

The modeling application may a computer program stored on a computer readable storage media, such as a CD disc, diskette, tape, or other media. In another embodiment, the modeling application is a computer program distributed over a computer-readable propagated signal, such as a program distributed over the Internet.

As mentioned, the system may include a haptic interface system, as shown in FIG. 3, including the haptic interface device 110 and the haptic rendering process 116 which generates a virtual object of the virtual environment to be "touched" and determines the results of the interaction (discussed in more detail below). The haptic interface device 110 is a tactile or force-feedback device which provides the touch sensations of interacting with virtual objects 126 to a user of the system. Some haptic interface devices 110 consist of an electro-mechanical linkage which can exert a controllable force on a user's hand. As used herein, "haptic rendering" refers to the creation of a virtual environment with which a user can interact through the sense of touch. The term "haptic rendering process" 116 refers to the computer program which generates the haptic aspects of the virtual environment and determines the forces to be applied to a user through a haptic interface. The haptic rendering process 116 generates haptic representations of virtual objects in the virtual environment.

Figure 4:
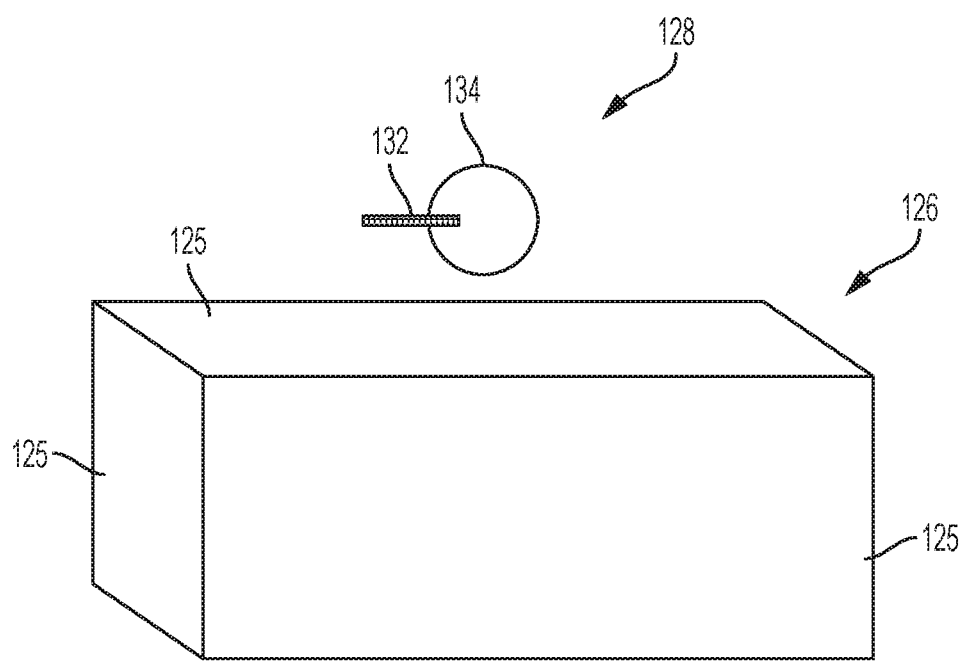
FIG. 4 illustrates a view of a virtual environment including a virtual object and a virtual tool, in accordance with embodiments of the invention.

FIG. 4 shows a haptic virtual environment including a virtual object 126 and a virtual tool 128. The virtual object 126 of the embodiment shown in FIG. 4 is depicted as a 3-D (three dimensional) block of material typically "floating" in the virtual space of the virtual environment. The virtual object 126 has virtual surfaces 125 that represent the "skin" of the virtual object 126. The virtual tool 128 is represented in FIG. 4 as a sphere 134 with a rod or "handle" 132 connected to it. As mentioned, however, in the embodiment the virtual tool 128 may be a user's hand having appropriate sensors applied thereto as will be described in greater detail below.

Figure 5:
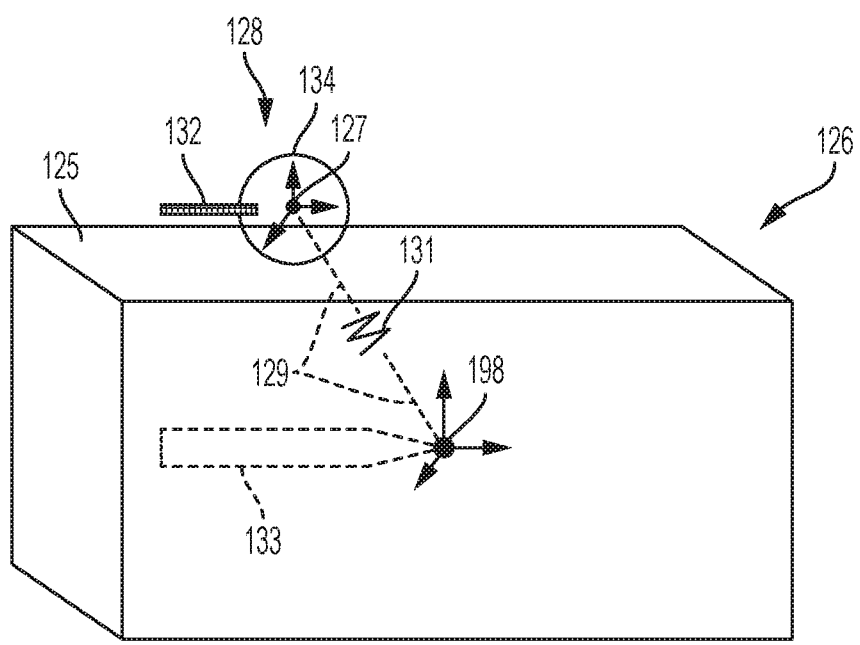
FIG. 5 illustrates a view of a virtual environment where a virtual tool contacts a virtual surface of the virtual object in connection with the haptic interface location with the virtual object, in accordance with embodiments of the invention.

In the exemplary illustration of FIGS. 4 and 5, the user uses a haptic interface device 110 in real space to grasp or manipulate the handle 132 of the virtual tool 128 in virtual space. In one embodiment, the location of this handle with respect to the virtual tool 128 can be changed interactively by the user. As used herein, a "haptic virtual environment" refers to a computer-generated virtual environment that can be explored by a user through the sense of touch. In one embodiment, the haptic virtual environment contains a virtual object 126 that is model of a real world object that a user is creating in the virtual environment. In another embodiment, the haptic virtual environment incorporates two or more virtual objects 126 that are linked to each other, such as in a hierarchical arrangement. It should be understood that the interaction and/or modification methods described herein may be readily extended to apply to two or more virtual objects 126 linked or associated in a haptic virtual environment.

FIG. 5 illustrates a view of a virtual environment where a virtual tool contacts a virtual surface of the virtual object in connection with the haptic interface location with the virtual object, in accordance with embodiments of the invention. More specifically, FIG. 5 illustrates a virtual tool 128 contacting the virtual surface 125 of a virtual object 126. The user guides the virtual tool 128 using the haptic interface device, represented, in this embodiment, by a stylus 133 in FIG. 5. The position and orientation of the tip of the stylus 133 indicate the haptic interface location 198. Note that, although the user may be manipulating a literal stylus in some embodiments, the haptic interface location 198 could be controlled by a user interacting with any number of differently shaped elements such as a finger, thimble, a yoke, or a ball. The tip of the virtual stylus 133 is indicated by the haptic interface location 198. In one embodiment, the haptic rendering process 116 tracks the haptic interface location 198, but does not otherwise track the shape or location of the entire haptic interface device 110.

The haptic rendering process 116 attempts to move the virtual tool 128 so that the origin 127 of the virtual tool 128 matches the haptic interface location 198. However, unless the haptic rendering process 116 is using the virtual tool 128 to remove material from the virtual object 26, then the haptic rendering process 116 typically does not allow the virtual tool 128 to penetrate the virtual object 126. Thus, as shown in FIG. 5, the user has attempted to move the virtual tool 128 into the virtual object 126, which is indicated by the haptic interface location 198 within the virtual object 126. The haptic rendering process 116 calculates a resistance to the movement of the virtual tool 128 into the virtual object 126 based on the material properties of the virtual object 126 entered as data by the user. This calculation is based, for example, on a connection 129 between the tool origin 127 and the haptic interface location 198. In another embodiment, the connection 129 includes a virtual spring 131 to enable calculation of the forces in a known mathematical manner. In one embodiment, the connection 129 includes a virtual dash-pot. Thus, if the user attempts to move the virtual tool 128 further into the virtual object 126, the haptic rendering process 116 calculates an increasing resistance force that is fed back to the user through the haptic interface device 110 based on the virtual spring 131. While the force calculation methods of FIG. 5 utilize a spring or dash-pot system, other known methods of calculating forces will be known to those of skill in the art and available through known computer drafting and machining software.

As already described, the user interacts with the virtual object 126 in the virtual environment through a virtual tool 128. The user may select any shape for the tool 128. The shape of the tool 128, along with other characteristics, such as interaction mode, determines the interaction with the virtual object 126. In one embodiment, the tool 128 may be represented as a series of discrete points in virtual space which outline a three-dimensional shape of the tool 128. The virtual tool 128 is modeled as a set of discrete points for the purposes of haptic interaction and collision detection with the virtual object 26. In another embodiment, the points of the virtual tool 128 are created by an algebraic equation or any other continuous or piecewise mathematical method suitable for determining a 3-D shape in a virtual environment. In another embodiment, the tool 128 can be represented directly by continuous or piecewise mathematical equations, rather than by discrete points. The virtual tool 128 may take on any of a number of shapes that may be useful for a user when using a virtual tool 128 to create a virtual object 126 in the virtual environment. Typical shapes may include a sphere or cylinder. In another embodiment, the user selects one or more interaction modes for the virtual tool 128, such as a sand paper mode, which causes the tool 128 to induce friction of the virtual object 126 or to remove material gradually from the virtual object 126, much like using real sandpaper to smooth the shape of a block of wood in the real world.

Figure 6:
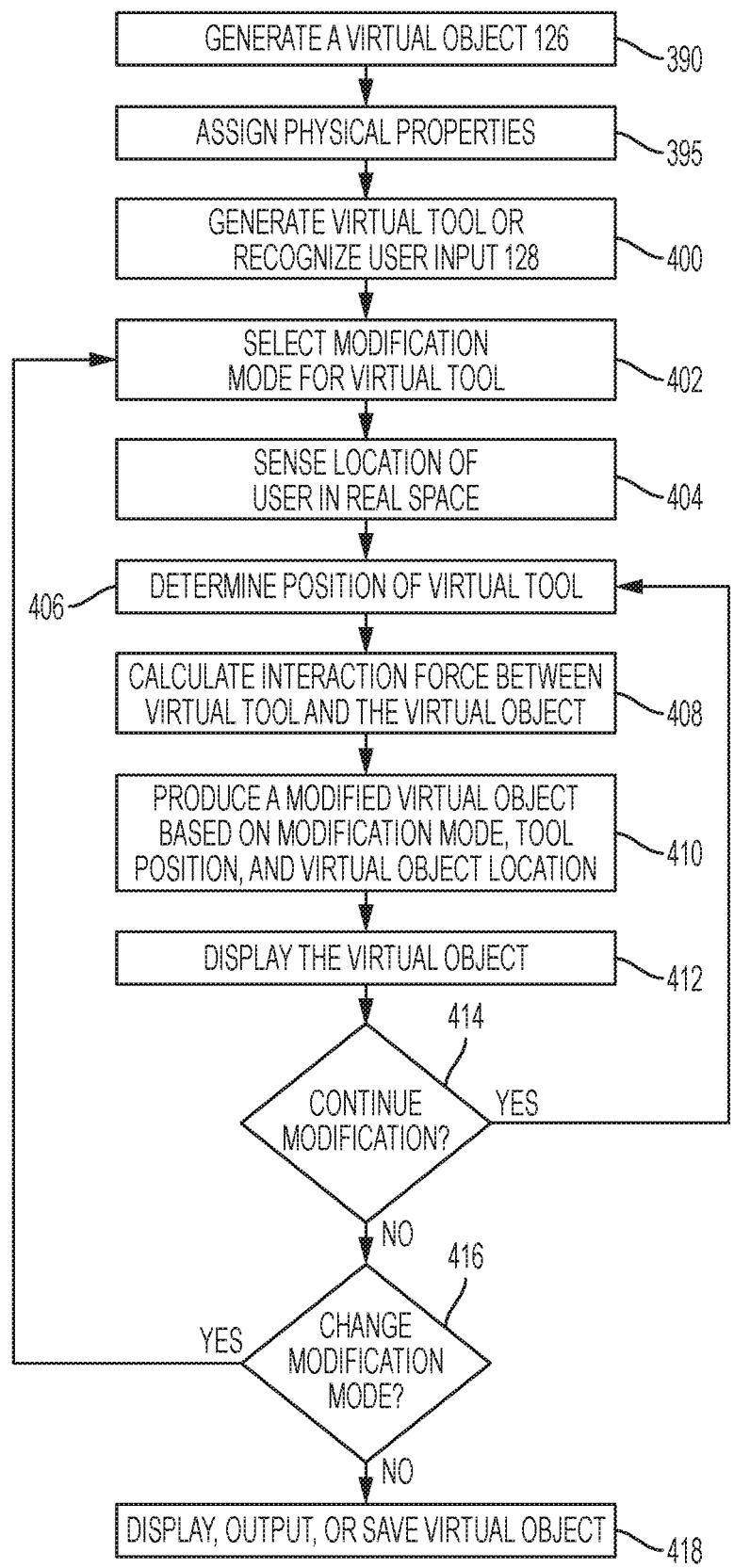
FIG. 6 illustrates a flowchart of the modification process occurring between a virtual tool and a virtual object, in accordance with embodiments of the invention.

FIG. 6 illustrates a flowchart of the modification process occurring between a virtual tool and a virtual object, in accordance with embodiments of the invention. More specifically, FIG. 6 illustrates a flowchart of the modification process occurring between a virtual tool 128 and virtual object 126. First, a virtual object 126 is generated at step 390 and physical properties are assigned to the virtual object 126 at step 395 using metadata. Next, a virtual tool 128 is determined or generated in virtual space that represents the haptic interface device 110 that the user is manipulating in real space (step 400). The virtual tool 128 may comprises a computer generated tool or may comprise a user-operated input such as a glove having sensors mounted thereto. For example, the virtual tool 128 may be a wearable device (e.g. ring) on the thumb and index finger or an embeddable device (e-tattoo, or conductive paint) on the nails or fingers, so the device will measure the relative movement between the tool 128 and object 126 and also the relative speed and direction of movement. In one embodiment, the haptic rendering process 116 generates the virtual tool 128. In another embodiment, the system detects the user-operated input by receiving signals indicative of motion and forces applied by the tool 128. The user then selects a modification mode that determines what kind of modification occurs to the virtual object 126 as a result of interaction between the virtual object 126 and the virtual tool 128 (step 402). The modification modes can include application of force, application of temperature, application of spin, material modification, and other material modification modes. The material modification mode can include spinning, smoothing, mirroring, and other material modification modes.

In step 404, sensors determine the location of a user or user-operated input in real space. In one embodiment the user is manipulating a haptic interface device 110 such as a glove and sensors determine the position of the haptic interface device 110 in real space.

The modeling application 112 then determines the location of the discrete points of the virtual tool 128 relative to the location of the virtual object 126 (step 406). In one embodiment the haptic rendering process 116 determines these locations. The haptic rendering process 116 then calculates an interaction force between the virtual tool 128 and the virtual object 126 based on the locations of the points of the virtual tool 28 and the location of the virtual object 126 (step 408). In an embodiment, the user feels the interaction force through the haptic interface device 110, which thus provides feed back to the user on the interaction of the virtual tool 128 with the virtual object 126. In one embodiment, the haptic rendering processor 116 provides the interaction force to the haptic interface device 110. The virtual object 126 may include a virtual surface 125 and the position and orientation of the virtual tool 128 is determined relative to the virtual surface 125 based on the locations of the points of the virtual tool 28 compared to the virtual surface 125.

The modeling application 112 then produces a modified virtual object 126 by modifying the virtual object 126 based on the modification mode, the position of the virtual tool 128, the physical properties of the virtual object 126, and the location of the virtual object 126 (step 410). The modification processor 120 produces the modified virtual object 126. For example, if the virtual tool 128 is in a translation mode and the user is attempting to move the virtual object 126 with the virtual tool 128, then the modification processor 120 calculates the forces applied to the virtual object 126 as the user pushes the tool 128 against the object 126. If the modification mode is a spinning mode, and the user is applying a tangential force to the virtual object 126 with the virtual tool 128 (as though spinning a basketball), then the modification processor 120 calculates the spinning motion of the virtual object 126 based on the force and amount of tangential force that the user is applying to the virtual object 26.

The modified virtual object 126 is then output from the system. In one embodiment, the output is a modified visual image of the virtual object 126 that is output to a graphics display 114 by the modeling application 112 or graphics processor 122. In one embodiment, the output also includes a new or modified shape, which the user feels through the haptic device. The user then decides whether to continue with the modification process (step 414). If the user decides to continue in the same modification mode, the user makes an additional movement of the virtual tool 128, and the haptic rendering process 116 determines the new position of the virtual tool 128 (step 406). The user may decide to select a different modification mode (step 416) and returns to step 402 to select the new modification mode. If the user does not decide to make any further modifications, then the virtual object 126 may be displayed, output, or saved to a disk, tape, or other data storage device (step 418). Output may include output or export to on an alternate file format or a printing device or a device that provides a physical, real world model of the virtual object 126.

According to one aspect of the present invention, the calculation of interactive forces at step 408 may be scaled by the system to achieve certain reactions that cannot easily be achieved by actual physical contact. For example, the user may wish to spin the virtual object 126 by applying a tangential force; however, the user's finger having a sensor applied thereto my not be able to achieve the desired spin. In this case, the applied force by the user may be scaled mathematically, e.g. by multiplying the forces applied to the virtual object 126, to achieve a greater spin. In this example, the user may apply a tangential force of 10N and the system will scale the tangential force by a factor of 4 to be 40N. Other types of scaling is also envisioned with this invention to increase or decrease the applied force or other outside factor acting on the virtual object 126.

In accordance with this invention, a display apparatus is configured to produce an interactive three-dimensional holographic image where the physical properties of the object being displayed are taken into account during the rendering of the object. A coherent light source can produce one or more beams, based on obtained image data of an object to display. A lens assembly can be configured to direct the one or more beams, by dynamically changing a deflection angle, to form a holographic image of the object based on a focal length of the lens and a location of an observer. Further, one or more optical sensors can be configured to obtain information regarding whether an interactive device interrupts the one or more beams, in order to determine a location of the interactive device (e.g., a user's finger) with respect to the holographic image, based on the obtained information from the one or more optical sensors.

A holographic image can be created, for example, with two parabolic mirrors that are facing each other. A 3D object to be imaged can be located in the center of the lower mirror assembly and the object can be projected through an opening in the top mirror assembly. In essence the mirror assembly can allow imaging of the object at a virtually infinite number of views, each at different viewing angles, creating a holographic image of the 3D object above the top mirror assembly.

The display apparatus, according to embodiments described herein can create the same holographic image by projecting a plurality of object views, each at different viewing angles, above a lens assembly. A computer rendering engine, for example, can render a plurality of object views at different viewing angles based on a virtual object. Accordingly, a truly unobtrusive three-dimensional holographic display can be provided, without the need of a reflective medium. Moreover, a user can interact with the holographic image, based on information obtained from the optical sensors receiving reflected light from an interactive device interrupting a beam forming the image.

Figure 7:
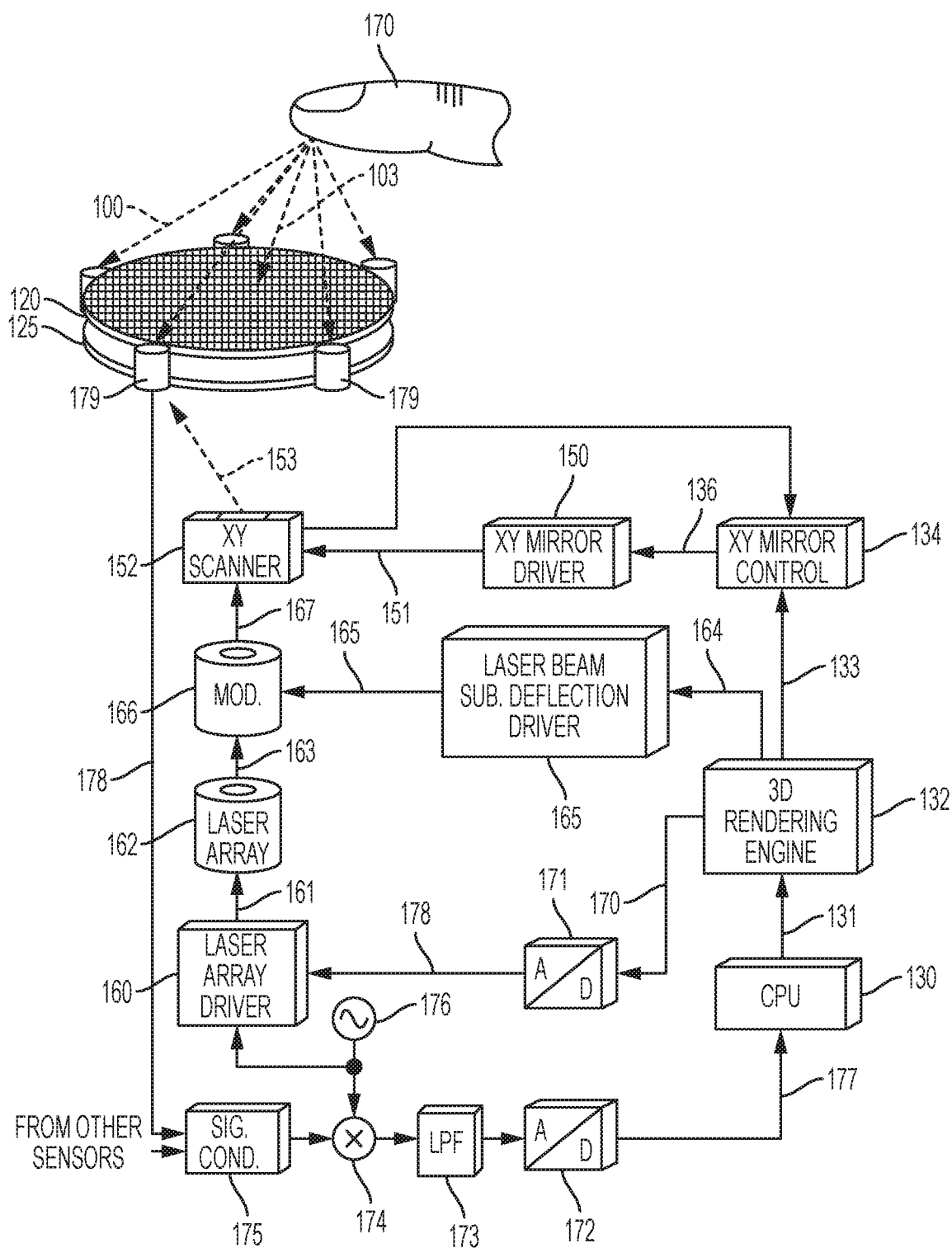
FIG. 7 illustrates an exemplary display apparatus configured to produce an interactive three-dimensional holographic image, in accordance with embodiments of the invention.

FIG. 7 illustrates an embodiment of a display apparatus configured to produce an interactive three-dimensional holographic image. As shown in FIG. 7, a lens assembly 100 includes a bottom lens 125 that can be a collimating lens, which can redirect a beam 153 from an XY scanner 152 into a direction that is perpendicular to the bottom surface of the top lens 120, for example. It is noted that XY scanner 152 can project monochrome or multi-color beam(s) 153. The top lens 120 can then deflect the beam 153 into a direction that is dependent upon the surface function thereof.

3D rendering engine 132 can generate digital timing signals 133 for the XY mirror control 134, a digital RGB data stream 170 to analog to digital converter (ADC) 171 and digital sub deflection signals 164.

ADC 171 can generate analog signals representative of the RGB intensities from the 3D rendering engine. Each analog signal can be buffered by a driver 160 which then can drive a corresponding laser in laser array 162. Laser array 162 can also include an infrared laser which can be used to detect the location of a finger 170 using sensor 179. In the alternative, a sensor may be located on the user's hand, for example on a glove positioned on the user's hand, and the sensor can be used to determine the position of the finger 170 as opposed to the arrangement of FIG. 7 where the sensor 179 detects the position of the finger 170. In the exemplary embodiment of FIG. 7, the infrared laser can be modulated by an oscillator 176. When the user interacts with the holographic image, the infrared laser beam can be reflected from the user's finger 170 and picked up by a plurality of sensors 179 arranged around mirror assembly 100, for example. The sense signals can be conditioned by one or more signal conditioners 175, which can include for example photodiode amplifier(s), or similar apparatus. The outputs from the signal conditioners 175 can be then demodulated by one or multiple demodulators 174 and then filtered by multiple low pass filter(s) 172. ADC 171 can convert the analog signals to a digital signal for further processing by the CPU 130, for example. According to an embodiment, each sensor can have its own signal conditioner, demodulator, low pass filter and/or ADC.

Digital sub deflection signals 164 can be comprised of two digital vectors X_SD and Y_SD, according to an embodiment. A laser beam sub deflection driver can convert X_SD and Y_SD to analog signals that can be buffered and control laser beam sub deflection modulator 166.

The phase-shift between the signal 176 and the received signal 178 can be a function of the distance the IR light traveled from laser array 163 to each of the sensors 179, among other variables. The demodulation gain can be a function of the cosine of the phase-shift and thus the digital results 177 out of ADC 172 can vary accordingly. In the particular implementation shown in FIG. 7, results 177 can be comprised of 5 digital results, for example, one for each of the sensors 179. The location of where the user interacts with the holographic image can be derived by trilateration based on the plurality of sensor signals, and/or other techniques known in the art.

XY scanner 153 can project one or more beams at any given angle toward the lens assembly 100. Each micro lens of the top lens 120 can be individually tuned, in order to provide a desired deflection angle based on its focal length, depending on the location of an observer. Also, a modulation function can be added to the beam 110 over the entire micro lens array (i.e., the entire top lens 120), such that the beam can be active at desired micro lenses and inactive where light should not be seen from the perspective of the observer (e.g., at predetermined deflection angles). The desired micro lens at which the beam should be activated can be determined based on the location of the observer, such that the beam(s) can be angled from the micro lens to the eye of the observer to provide a three-dimensional illusion of the object to be displayed. According to this exemplary embodiment, with a plurality of beams positioned by one or more micro lenses, the illusion of a displayed object at a certain point in space can be created.

Figure 8:
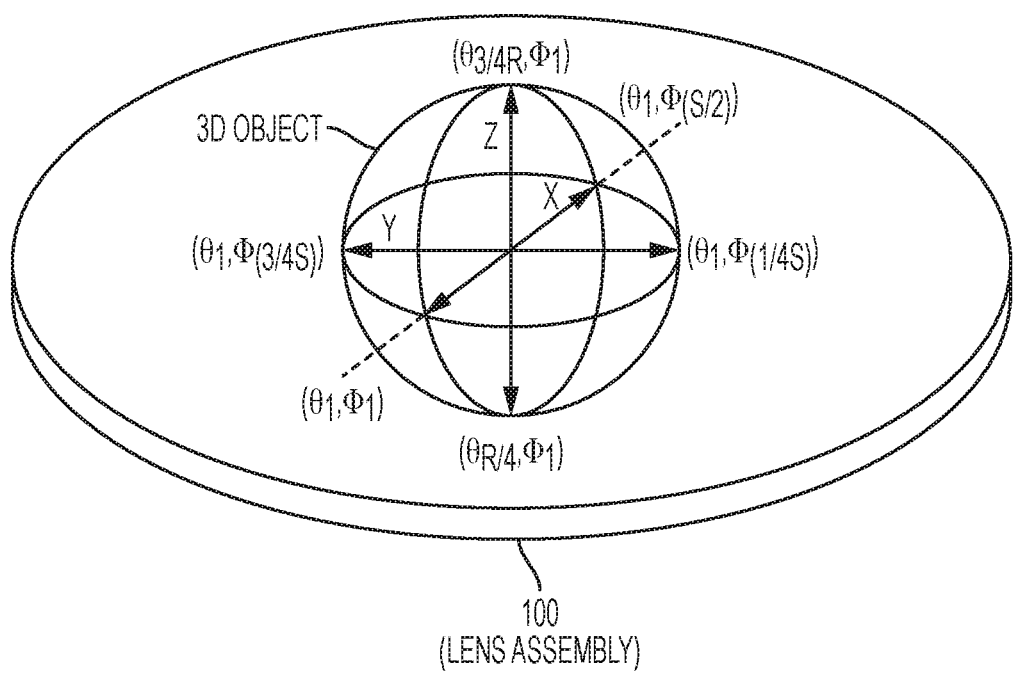
FIG. 8 illustrates exemplary parameters for an exemplary display apparatus configured to produce an interactive three-dimensional holographic image, in accordance with embodiments of the invention.

FIG. 8 shows various object views and associated parameters for an exemplary display apparatus configured to produce an interactive three-dimensional holographic image, according to one disclosed embodiment. For holographic viewing in a given viewing direction at least two object views can be needed: a first object view at a first viewing angle and second object view at a second viewing angle, the first object view creating a projection into the left eye, for example, while the second object view creates a projection into the right eye, for example. This can create a plurality of views, each object view having a unique inclination angle $\theta$ and azimuth angle $\phi$ relative to the surface of the micro-lens array. A total of R×S views can be generated where S is the maximum number of inclination angles and S is the maximum number of azimuth angles.

Optical sensors 179 can be fixed to or removably placed around lens assembly 100 and communicatively coupled to processor unit 130 and/or a host CPU. When an interactive device, such as a finger or a stylus (a finger 170 is depicted in FIG. 7 for exemplary purposes), interrupts a beam projected above lens assembly 100, the beam can be reflected back and received at one or more of optical sensors 179. Based on the modulation of the reflected beam, for example, which can be previously known by processor unit 130, processor unit 130 can determine where, with respect to the displayed image, the interactive device is located. Using trilateration, based on reflected modulated beams at a plurality of optical sensors 179, processor unit 130 can determine an accurate location of the interactive device (e.g., finger 179), with respect to the displayed image. Once a location of the interactive device is determined, a user can manipulate the displayed image using any known touch or multi-touch mechanisms (see FIG. 10 discussed below), without departing from the scope of the present disclosure.

Figure 9:
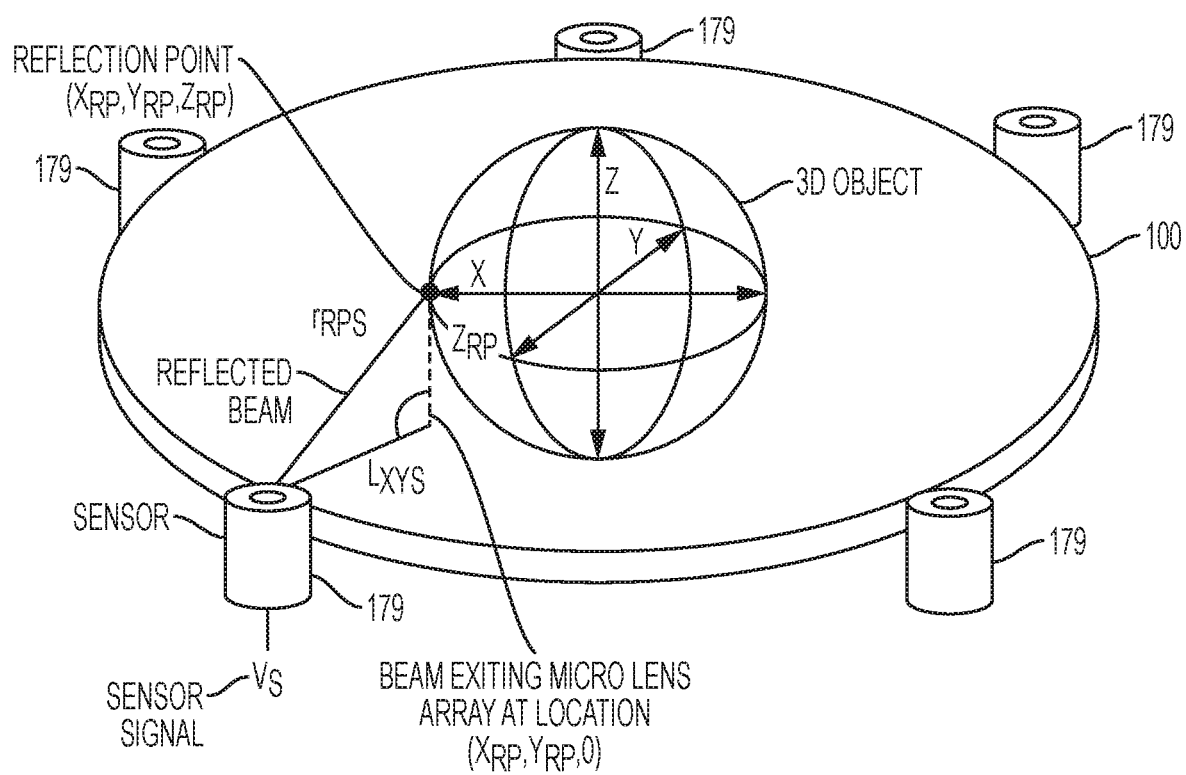
FIG. 9 illustrates an exemplary feedback system of an exemplary display apparatus, in accordance with embodiments of the present invention.

FIG. 9 illustrates an exemplary feedback system of an exemplary display apparatus, according to one disclosed embodiment. The feedback system, as depicted in FIG. 9 can be used in order to determine the location of an object (such as a user's finger 170) and therefore enable the user to interact with the holographic object. The holographic display apparatus can have a dedicated touch scan to image the virtual display volume (e.g., the virtual volume into which the holographic object is projected). The sub deflection function during this touch scan can be adjusted such that the infrared laser beam, for example, exits the currently swept micro-lens perpendicularly (i.e. along the focal axis of the micro-lens currently being swept).

An object above the micro lens array, according to the depicted example, can cause reflections, which are picked up by a plurality of sensors 179 arranged around the micro lens array. The (x,y) coordinate at which the reflection occurs can be determined, as the reflection point coincides with a particular micro-lens being swept.

Figure 10:
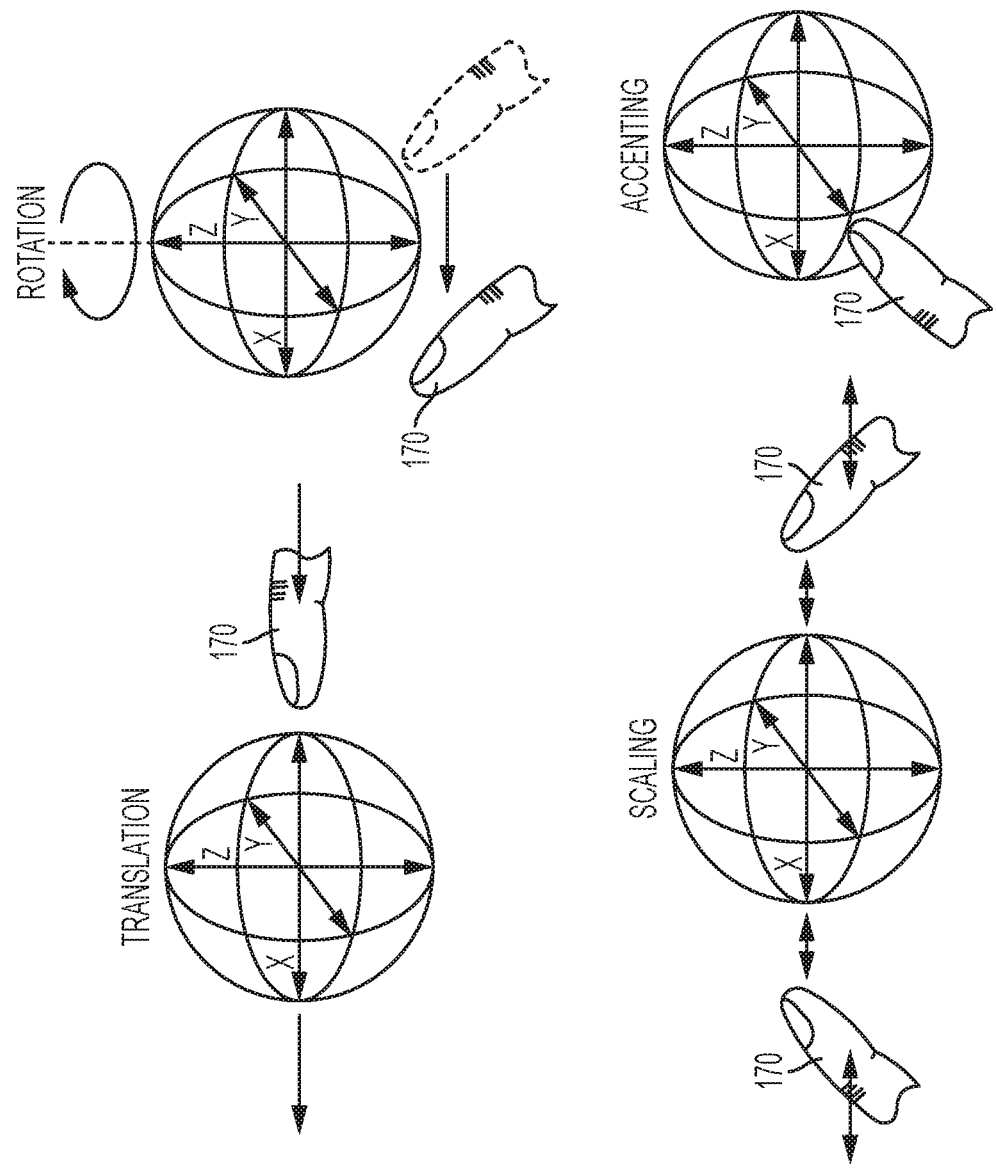
FIG. 10 illustrates various exemplary interactions with a holographic displayed three-dimensional image, in accordance with embodiments of the present invention.

FIG. 10 illustrates various exemplary interactions with a holographic displayed three-dimensional image according to the present invention. As shown in FIG. 10, a finger 170 approaching the holographic object may accent features of the object, such as intensity at the point where the finger approaches the holographic object (see the lower right portion of FIG. 10).

Single finger gestures can be used to rotate and move the object in any direction. For example, a user's finger 170 approaching the holographic object from the right can move the object to the left after making contact with the objects projected surface to apply a tangential force (see the upper right portion of FIG. 10). Linear motions can have inertia and the amount of inertia can be a function of how quickly the user's finger approaches or pushes the holographic object (see the upper left portion of FIG. 10). Moving the finger parallel to the object surface can cause object rotation towards the direction of the finger movement. Rotation could have inertia such that the object keeps rotating at a rate proportional to the velocity of the finger movement.

Scaling of the holographic object can be accomplished by using at least 2 fingers (see the lower left portion of FIG. 10). For example, scaling in the x-direction can be accomplished by touching the left side of the object with the left index finger and the right side of the object with the right index finger and then increasing or decreasing the distance between the index fingers to scale the holographic object up or down, respectively.

It is noted that processor unit 130 of FIG. 7, and any other processing units, may include any number of devices or device combinations as known in the art. These include, for example, general purpose processors, content addressable memory modules, digital signal processors, application-specific integrated circuits, field programmable gate arrays, programmable logic arrays, discrete gate or transistor logic, or other such electronic components.

Furthermore, the steps of a method or algorithm described in connection with the embodiments disclosed herein can be embodied directly in hardware, in firmware, in a software module executed by processor unit 130 of FIG. 7, or in any practical combination thereof. A software module can reside in computer-readable storage (not shown), which can be realized as random access memory (RAM), flash memory, read only memory (ROM), erasable programmable ROM (EPROM) memory, electrostatically erasable programmable ROM (EEPROM) memory, registers, a hard disk, a removable disk, a compact disc (CD)-ROM, or any other form of storage medium known in the art. In this regard, computer-readable storage can be coupled to processor unit so that the processor unit can read information from, and write information to, the computer-readable storage. In some embodiments, the computer-readable storage can include cache memory for storing temporary variables or other intermediate information during execution of instructions by the processor unit. In some embodiments, the computer-readable storage can include non-volatile memory.

Figure 11:
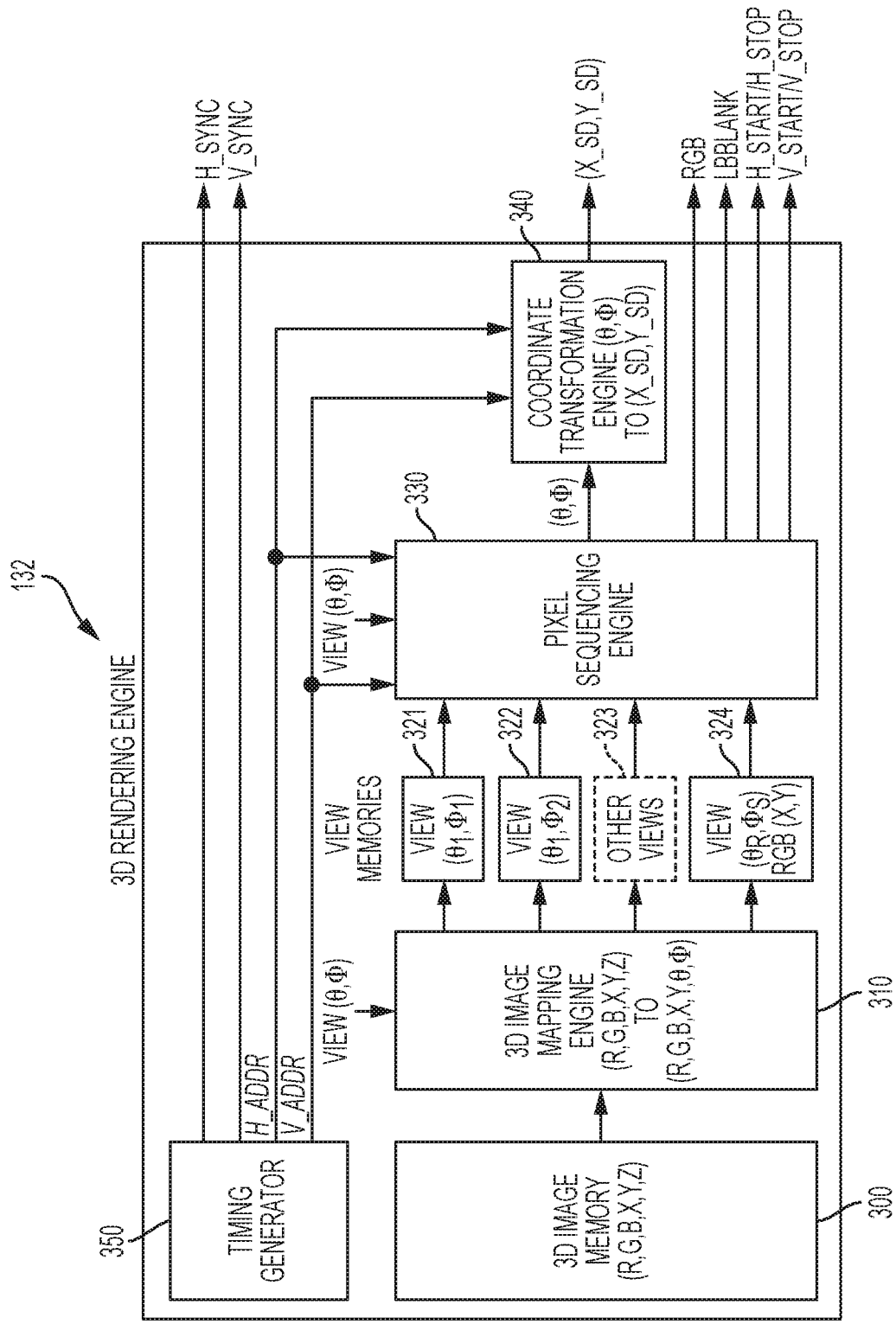
FIG. 11 shows an exemplary detailed 3D rendering engine, in accordance with embodiments of the present invention.

FIG. 11 shows an exemplary detailed 3D rendering engine 132, according to an exemplary embodiment. According to the depicted embodiment, 3D image memory 300 can include the rendered 3D object. Each object pixel (or vortex) can have the format (R,G,B,X,Y,Z), where R, G and B can provide the pixel intensities of the red, green and blue pixel color components, respectively, and X, Y, Z can provide the x, y and z location of the pixels, respectively.

A mapping engine 310 can map a given 3D pixel to 2D space based on an azimuth and inclination angle and essentially performs the transformation: (R,G,B,X,Y,Z)→(R,G,B,X,Y,$\theta$,$\phi$), for example. The mapping engine 310 can create a plurality of views based a plurality of viewing angles ($\theta$, $\phi$) and store the views in a plurality of view memories 321-324.

The pixel sequencing engine 330 can sequence the pixels and viewing angles ($\theta$, $\phi$) from the view memories 321-324 based on the current scan location. A coordinate transformation engine 340 can map the plurality of viewing angles ($\theta$, $\phi$) in polar form to sub deflection values (X_SD, Y_SD) representative of angles of reflection, for example.

A timing generator 350 can generate the horizontal and vertical synchronization signals HSYNC and VSYNC, which can be required by the mirror driver, and also generate the horizontal and vertical addresses that can provide a current scan location of the micro lens array. Note that the 3D rendering engine 132 may be integrated in whole or in part into a graphics processor unit (GPU) or maybe entirely separate. Imaging mapping engine may generate the views in real time without the need or at least with substantially fewer view memories, according to an embodiment.

Figure 12:
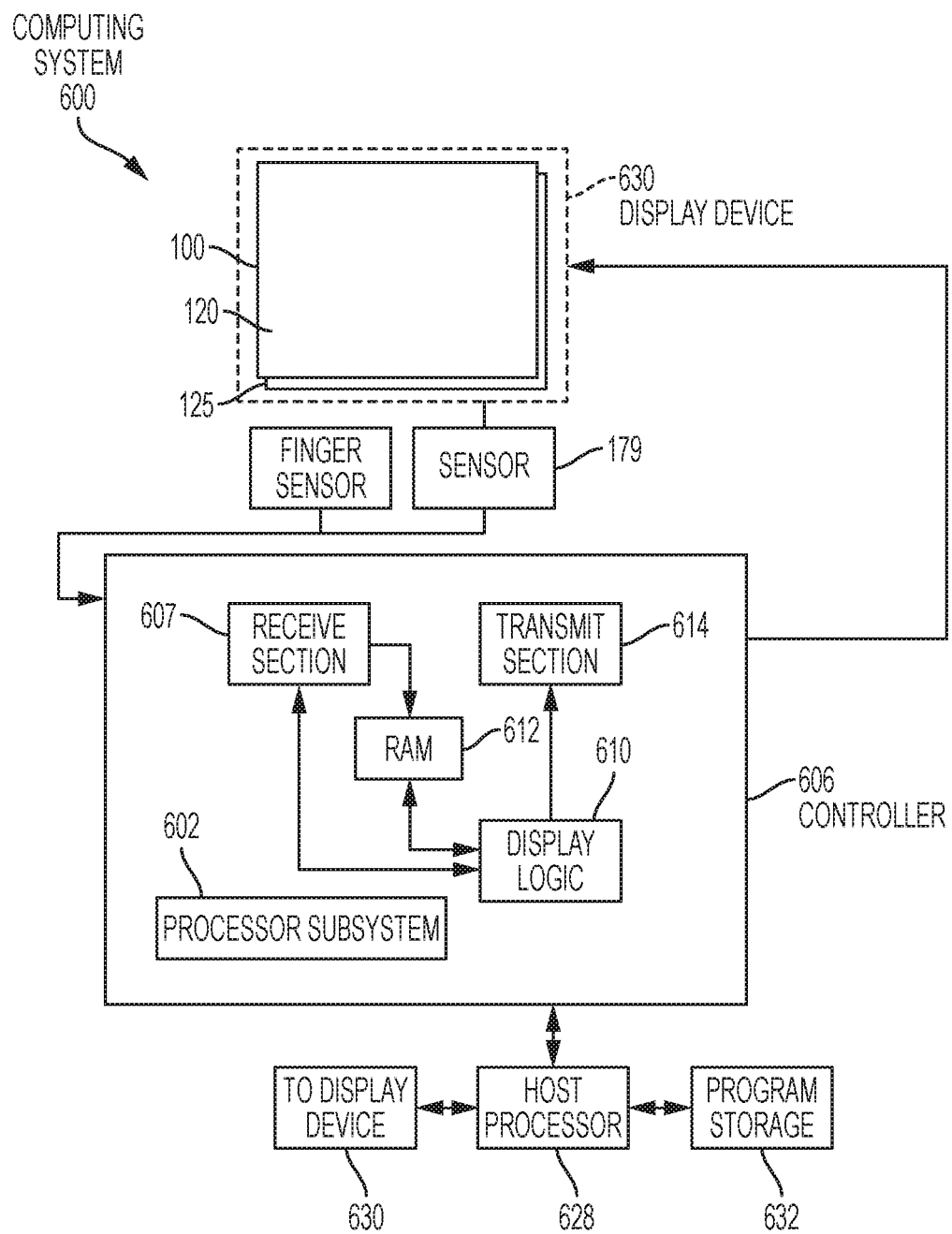
FIG. 12 illustrates an exemplary computing system including an interactive three-dimensional holographic display, in accordance with embodiments of the present invention.

FIG. 12 illustrates exemplary computing system 600 that can include one or more of the embodiments described above. Computing system 600 can include one or more of processor 602 and controller 606. Controller 606 can include, but is not limited to, transmit section 614, receive section 607 and display logic 610. Display logic 610 can access RAM 612. In addition, display logic 610 can control transmit logic 614 to generate an electric field to control the refractive index, and thus a phase shift, at various cells 121, for example. Receive logic 607 receives incoming signals from the optical sensor(s) 150/379, in order to determine the location of an interactive device with respect to the displayed image of the object. In some embodiments, controller 606 and processor 602 can be integrated into a single application specific integrated circuit (ASIC).

Figure 13:
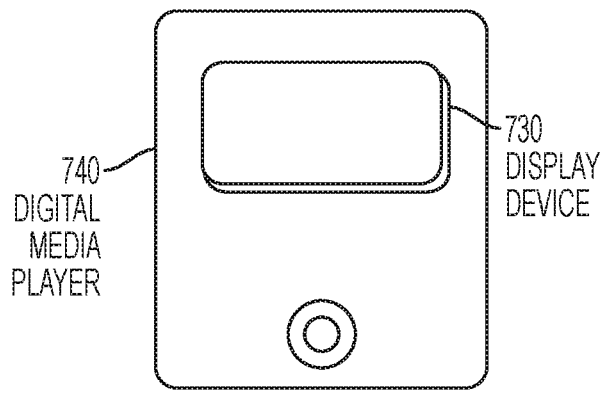
FIG. 13 illustrates an exemplary digital media player having an interactive three-dimensional holographic display, in accordance with embodiments of the present invention.

FIG. 13 illustrates exemplary digital media player 740 that can include a display device 730, the display device 730 including an interactive three-dimensional holographic display, according to one disclosed embodiment.

Figure 14:
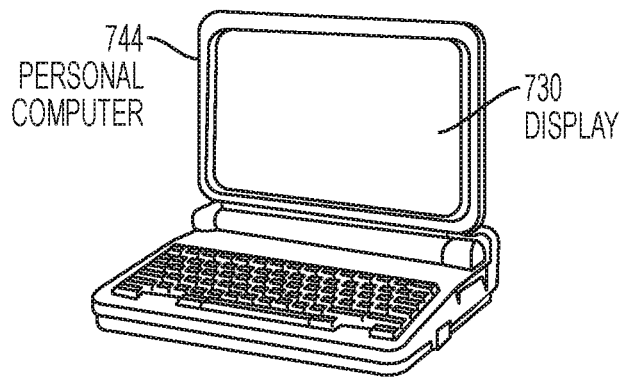
FIG. 14 illustrates an exemplary personal computer having an interactive three-dimensional holographic display, in accordance with embodiments of the present invention.

FIG. 14 illustrates exemplary personal computer 744 that can include a display 730, the display device 730 including an interactive three-dimensional holographic display, according to one disclosed embodiment.

Figure 15:
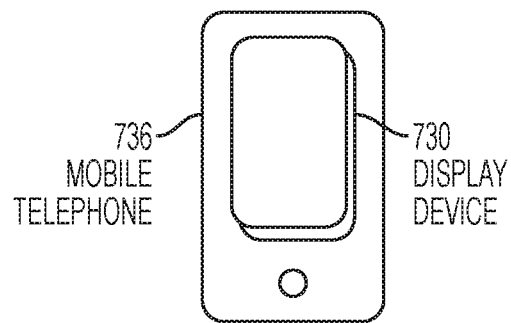
FIG. 15 illustrates an exemplary mobile telephone having an interactive three-dimensional holographic display, in accordance with embodiments of the present invention.

FIG. 15 illustrates exemplary mobile telephone 736 that can include a display device 730, the display device 730 including an interactive three-dimensional holographic display, according to one disclosed embodiment.

The mobile telephone, media player and personal computer of FIGS. 13, 14 and 15, respectively, can provide a three-dimensional viewing and interacting experience, without the requirement of a reflective medium or wearing 3D glasses, according to disclosed embodiments. Accordingly, a truly unobtrusive interactive three-dimensional holographic display can be provided.

In accordance with the forgoing invention disclosure, it is apparent that each digital object will be assigned with appropriate physical properties as metadata of the digital object, for example, hardness, water content, compressive strength, viscosity etc. A user may scale up or down such physical properties during interaction. When holographic 3D object is created, then such physical properties will also be associated with the holographic object.

Cameras and proximity sensors installed in the device will analyze hand or finger movement pattern around the holographic object and accordingly will identify the type of applied force, amount of applied force and detection of applied force on the holographic object.

The device will change the structure and shape of the holographic 3D object based on identified force parameters and selected scale. The shape of the object will be changed accordingly to the laws of physical objects. The Device will connect to study material contents and accordingly projection pattern will be changed to create new or changed holographic 3D shape.

Wearable or embeddable devices fixed in hand/finger and accordingly software can precisely measure the relative finger movement and direction, this will help to calculate the applied force, type of force and direction of applied force very precisely. For example, user is using wearable device (e.g. ring) in thumb and index finger or embeddable device (e-tattoo, or conductive paint) in nails or fingers, so the said devices will measure the relative movement among each other and also speed and direction of movement, so the paired computing devices will precisely measure the movement and forces very precisely.

In the conventional art, the physical properties of the selected material are not considered while changing the shape. With this invention, the physical properties of any selected material are defined, e.g. viscosity, cohesiveness, compressive and tensile strength etc., based holographic object creation. Cameras and sensors installed in the system will track user's hand movement type to identify: 1. Type of applied force; 2. Direction of applied force; 3. Amount of applied force; and 4. Duration of applied force. Then, the shape of the holographic object will be changed. For example, how rotational force on pottery wheel can create different shape from clay may be examined. A user can use the methods of this invention to create different shapes of the holographic object.

Figure 16:
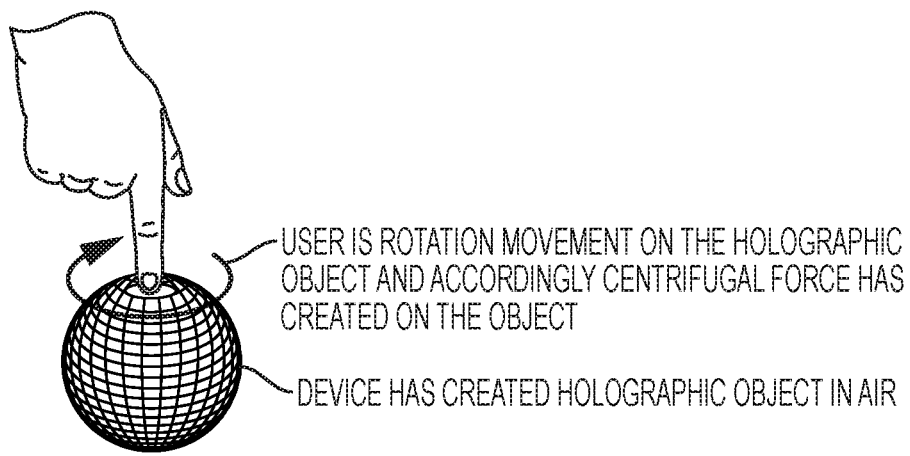
FIG. 16 illustrate a virtual object in the form of clay displayed as a hologram with a mobile device used to input data such as scale and applied force with rotation being imparted tot the object by a user, in accordance with embodiments of the present invention.
Figure 16:
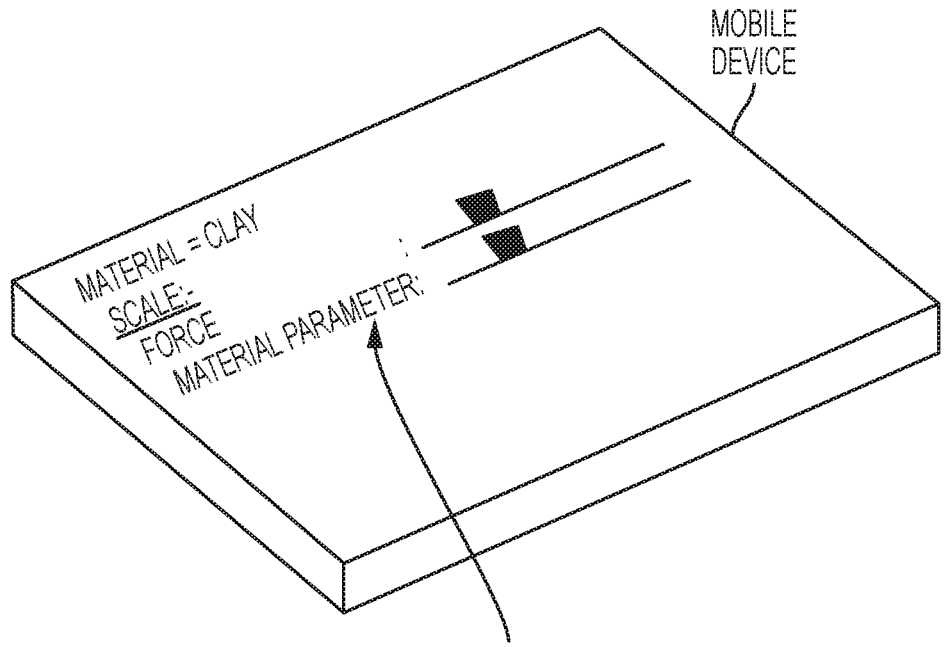
Figure 17:
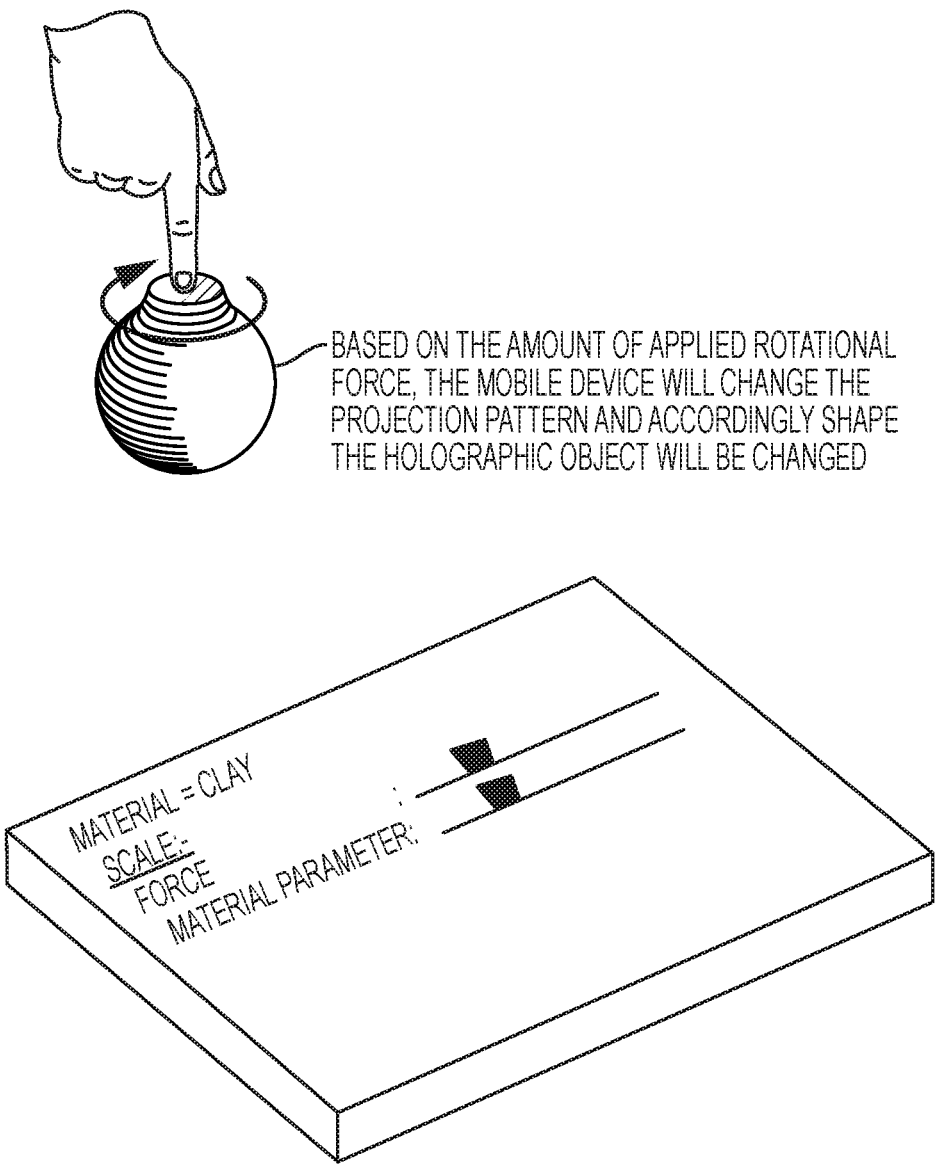
FIG. 17 illustrate the virtual object of FIG. 16 after modification based on user applied forces and rotation upon the clay object displayed as a hologram, in accordance with embodiments of the present invention.

With reference to FIGS. 16 and 17, a user may select clay as the preferred material and also has selected appropriate scale for the clay model. The simulated force applied by the user will be calculated based on the selected scale and the input received from sensors mounted on the user's finger. The holographic system described above will be used to create a holographic object. Software will consider the created holographic object is a simulated clay object. A user can select dimensions of the holographic object with existing methods known in the art. With this invention, the user may apply a simulated force on the holographic object, and cameras and sensors installed in the device will analyze the pattern of hand or finger movement, speed of movement and accordingly will identify type, direction and amount of applied force.

Again, with reference to FIGS. 16 and 17, software has analyzed the amount of applied force, direction of force, and type of applied force, accordingly from the selected scale, and selected simulated material software has will connect to data stored in the system to calculate the possible shape, accordingly, the holographic projector will recreate new shape of the object gradually. In this invention, the user will identifier and visualize how the object is changing based on applied force and associated parameters.

Figure 18:
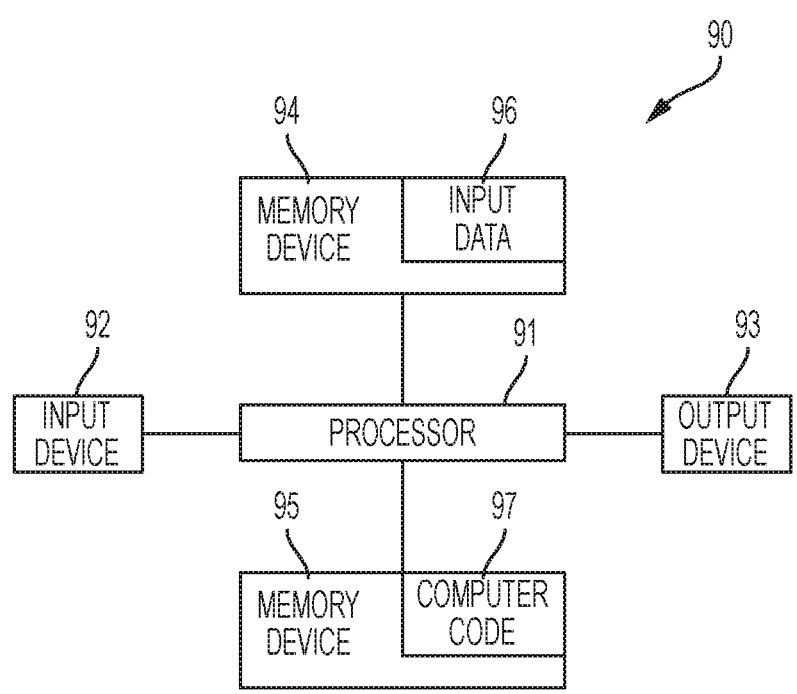
FIG. 18 illustrates a computer system used for implementing the methods of the present invention.

FIG. 18 illustrates a computer system 90 used for implementing the methods of the present invention. The computer system 90 includes a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97 which is a computer program that includes computer-executable instructions. The computer code 97 includes software or program instructions that may implement an algorithm for implementing methods of the present invention. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 18) may be used as a computer usable storage medium (or program storage device) having a computer readable program embodied therein and/or having other data stored therein, wherein the computer readable program includes the computer code 97. Generally, a computer program product (or, alternatively, an article of manufacture) of the computer system 90 may include the computer usable storage medium (or said program storage device).

The processor 91 may represent one or more processors. The memory device 94 and/or the memory device 95 may represent one or more computer readable hardware storage devices and/or one or more memories.

Thus the present invention discloses a process for supporting, deploying and/or integrating computer infrastructure, integrating, hosting, maintaining, and deploying computer-readable code into the computer system 90, wherein the code in combination with the computer system 90 is capable of implementing the methods of the present invention.

While FIG. 18 shows the computer system 90 as a particular configuration of hardware and software, any configuration of hardware and software, as would be known to a person of ordinary skill in the art, may be utilized for the purposes stated supra in conjunction with the particular computer system 90 of FIG. 9. For example, the memory devices 94 and 95 may be portions of a single memory device rather than separate memory devices.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

What is claimed is:

1. A method of producing an interactive three-dimensional holographic image, said method comprising the steps of:
   generating, by one or more processors of a computer system, a virtual object, said virtual object being assigned a location within a virtual space of a virtual environment and a movement state at the location;
   assigning physical properties to said virtual object using metadata, said physical properties including at least a material of the virtual object and accompanying material properties;
   determining a position of a virtual tool;
   receiving signals from said virtual tool, wherein the signals include information related to movement of said virtual tool relative to said virtual object;
   calculating an interactive force generated on the virtual object by said virtual tool based on said signals from said virtual tool and said position of said virtual tool;
   generating a deformed modified virtual object based on application of said interactive force to said virtual object, wherein the deformed modified virtual object includes an update to at least one of the location and the movement state, and wherein said physical properties assigned to said virtual object are accounted for in the deformed modified virtual object and the update to at least one of the location and the movement state; and displaying said deformed modified virtual object as a holographic image within the virtual space of the virtual environment.

2. The method of claim 1, wherein said method further comprises:
providing additional modification to said virtual object based on additional interactive force between said virtual tool and said virtual object.

3. The method of claim 2, wherein said method further comprises generating a modified hologram image of said modified virtual object utilizing said additional modification.

4. The method of claim 1, further comprising the steps of:
determining a force feedback according to the position of the virtual tool in relation to the virtual object;
sending the force feedback to a user through a haptic interface device; and
updating the force feedback according to movement of the virtual tool in real space.

5. The method of claim 4, wherein said haptic interface device provides a touch sensation related to an interacting of said user with said virtual object.

6. The method of claim 4, wherein said haptic interface device provides an electro-mechanical linkage which can exert a controllable force on a user's hand.

7. The method of claim 4, wherein said haptic interface device generates haptic aspects of the virtual environment and determines forces to be applied to the user through said haptic interface.

8. The method of claim 1, further comprising:
receiving a selection of a modification mode, said modification mode indicating a kind of modification that occurs to said virtual object as a result of interaction between said virtual tool and said virtual object;
wherein said step of generating said deformed modified virtual object is further based on said selection of said modification mode.

9. The method of claim 1, further comprising the steps of:
determining a position of said virtual tool based on signals received from sensors mounted to a user.

10. The method of claim 1, further comprising the steps of:
determining a position of said virtual tool based on signals received from sensors positioned remote from a user, said sensors detecting a position of said virtual tool.

11. A computer program product comprising:
a computer-readable storage device; and
a computer-readable program code stored in the computer-readable storage device, the computer readable program code containing instructions executable by a processor of a computer system to implement a method of generating a hologram image, the method comprising:
generating a virtual object, said virtual object being assigned a location within a virtual space of a virtual environment and a movement state at the location;
assigning physical properties to said virtual object using metadata, said physical properties including at least a material of the virtual object and accompanying material properties;
determining a position of a virtual tool;
receiving signals from said virtual tool, wherein said signals include information related to movement of said virtual tool relative to said virtual object;
calculating an interactive force generated on the virtual object by said virtual tool based on said signals from said virtual tool and said position of said virtual tool;
generating a deformed modified virtual object based on application of said interactive force to said virtual object, wherein the deformed modified virtual object includes an update to at least one of the location and the movement state, and wherein said physical properties assigned to said virtual object are accounted for in the deformed modified virtual object and the update to at least one of the location and the movement state; and
displaying said deformed modified virtual object as a holographic image within the virtual space of the virtual environment.

12. The computer program product of claim 11, wherein said method further comprises the step of providing additional modification to said virtual object based on addition interactive force between said virtual tool and said virtual object.

13. The computer program product of claim 11, further comprising:
determining a force feedback according to the position of the virtual tool in relation to the virtual object;
sending the force feedback to the user through a haptic interface device; and
updating the force feedback according to movement of the virtual tool in real space.

14. The computer program product of claim 13, wherein said haptic interface device provides a touch sensation related to an interacting of said user with said virtual object.

15. The computer program product of claim 13, wherein said haptic interface device provides an electro-mechanical linkage which can exert a controllable force on a user's hand.

16. The computer program product of claim 13, wherein said haptic interface device generates haptic aspects of the virtual environment and determines the forces to be applied to a user through a haptic interface.

17. The computer program product of claim 11, wherein the method further comprises:
receiving a selection of a modification mode, said modification mode indicating a kind of modification that occurs to said virtual object as a result of interaction between said virtual tool and said virtual object;
wherein said step of generating said deformed modified virtual object is further based on said selection of said modification mode.

18. A computer system for creating a virtual object in a virtual environment, the system comprising:
a central processing unit (CPU);
a memory coupled to said CPU; and
a computer readable storage device coupled to the CPU, the storage device containing instructions executable by the CPU via the memory to implement a method of creating a virtual object, the method comprising the steps of:
generating a virtual object, said virtual object being assigned a location within a virtual space of a virtual environment and a movement state at the location;
assigning physical properties to the virtual object via computer input, said physical properties including at least a material of the virtual object and accompanying material properties;
determining a position of a virtual tool in the virtual environment corresponding to a location of a user in real space;
receiving signals from said virtual tool, wherein the signals include information related to movement of said virtual tool relative to said virtual object;

calculating forces generated on the virtual object by said virtual tool based on said signals and said position of said virtual tool;

modifying the shape of said virtual object according to said calculated forces generated by said virtual tool, wherein the deformed modified virtual object includes an update to at least one of the location and the movement state, and wherein said physical properties assigned to said virtual object are accounted for in the deformed modified virtual object and the update to at least one of the location and the movement state; and displaying said deformed modified virtual object as a holographic image within the virtual space of the virtual environment.

19. The computer system of claim 18, wherein said virtual environment comprises a haptic virtual environment including sensors for determining said position of said virtual tool.

20. The computer system of claim 18, wherein the method further comprises:

receiving a selection of a modification mode, said modification mode indicating a kind of modification that occurs to said virtual object as a result of interaction between said virtual tool and said virtual object;

wherein said step of modifying the shape of said virtual object is further based on said selection of said modification mode.

\* \* \* \* \*